(12) United States Patent
Allan et al.

(10) Patent No.: US 6,649,326 B2
(45) Date of Patent: Nov. 18, 2003

(54) PHOTOLITHOGRAPHIC METHOD AND UV TRANSMITTING FLUORIDE CRYSTALS WITH MINIMIZED SPATIAL DISPERSION

(75) Inventors: Douglas C. Allan, Corning, NY (US); Nicholas F. Borrelli, Elmira, NY (US); Charlene M. Smith, Corning, NY (US); Robert W. Sparrow, Sturbridge, MA (US)

(73) Assignee: Corning Incorporated, Corning, NY (US)

( * ) Notice: Subject to any disclaimer, the term of this patent is extended or adjusted under 35 U.S.C. 154(b) by 10 days.

(21) Appl. No.: 10/177,065

(22) Filed: Jun. 21, 2002

(65) Prior Publication Data

US 2003/0091934 A1 May 15, 2003

Related U.S. Application Data

(60) Provisional application No. 60/322,408, filed on Sep. 14, 2001.

(51) Int. Cl.[7] .......................... G02B 5/00; G02B 11/00; G03F 1/00; G03C 5/00
(52) U.S. Cl. ...................... 430/311; 430/321; 430/322; 423/490; 423/489; 501/3; 501/40; 501/905; 359/352; 359/350; 359/361; 359/642
(58) Field of Search ................................ 430/311, 321, 430/322; 423/490, 489; 501/3, 40, 905; 359/352, 350, 361, 642

(56) References Cited

U.S. PATENT DOCUMENTS

| | | | |
|---|---|---|---|
| 2,498,186 A | 2/1950 | Stockbarger et al. | 423/163 |
| 2,550,173 A | 4/1951 | Swinehart et al. | 423/178 |
| 3,766,080 A | 10/1973 | Swinehart et al. | 250/584 |
| 3,769,230 A | 10/1973 | Robinson et al. | 252/301.4 H |
| 3,959,442 A | 5/1976 | Pastor et al. | 252/301 |

(List continued on next page.)

FOREIGN PATENT DOCUMENTS

| | | |
|---|---|---|
| DE | 1 291 321 | 3/1969 |
| DE | 222 426 A1 | 5/1998 |

(List continued on next page.)

OTHER PUBLICATIONS

"Growth and Properties of Scintillating Crystals BaF2," Jiang et al., Journal of Crystal Growth, vol. 79, No. 1–3, Dec. 1986, pp. 720–722.

"Modern Optical Engineering–The Design of Optical Systems," Warren J. Smith, Modern Opt Eng, McGraw–Hill Book Company, 1966, Article: "Optical Materials and Coatings," pp 145–161; Article: "The Design of Optical Systems: General," pp 326–355.

(List continued on next page.)

Primary Examiner—Mark F. Huff
Assistant Examiner—Daborah Chacko Davis
(74) Attorney, Agent, or Firm—Walter M. Douglas; Edward F. Murphy

(57) ABSTRACT

The invention provides a UV below 200 nm lithography method. The invention includes providing a below 200 nm radiation source for producing <200-nm light, providing a plurality of mixed cubic fluoride crystal optical elements, with the fluoride crystals comprised of a combination of alkaline earth cations having different optical polarizabilities such as to produce an overall isotropic polarizability which minimizes the fluoride crystal spatial dispersion below 200 nm, transmitting <200-nm light through the cubic fluoride crystal optical elements, forming a lithography pattern with the light, reducing the lithography pattern and projecting the lithography pattern with the cubic fluoride crystal optical elements onto a UV radiation sensitive lithography printing medium to form a printed lithographic pattern. The invention includes making the mixed fluoride crystals and forming optical element therefrom.

33 Claims, 5 Drawing Sheets

U.S. PATENT DOCUMENTS

| | | | |
|---|---|---|---|
| 4,038,201 A | 7/1977 | Hargreaves | 252/300 |
| 4,048,514 A | 9/1977 | Haussuehl et al. | 307/88.3 |
| 4,053,572 A | 10/1977 | Moss et al. | 423/490 |
| 4,101,331 A | 7/1978 | Anderson | 106/73.1 |
| 4,128,589 A | 12/1978 | Pastor et al. | 260/653 |
| 5,000,548 A | 3/1991 | Mercado | 354/414 |
| 5,039,858 A | 8/1991 | Anderson et al. | 250/363.03 |
| 5,147,742 A | 9/1992 | Ban et al. | 430/5 |
| 5,852,627 A | 12/1998 | Ershov | 372/108 |
| 5,856,991 A | 1/1999 | Ershov | 372/57 |
| 5,901,163 A | 5/1999 | Ershov | 372/20 |
| 5,970,082 A | 10/1999 | Ershov | 372/102 |
| 5,978,409 A | 11/1999 | Das et al. | 372/100 |
| 5,982,800 A | 11/1999 | Ishihara et al. | 372/57 |
| 6,061,174 A | 5/2000 | Shiozawa et al. | 359/361 |
| 6,069,749 A | 5/2000 | Omura | 359/727 |
| 6,181,480 B1 | 1/2001 | Ito | 359/656 |
| 6,201,634 B1 | 3/2001 | Sakuma et al. | 359/322 |
| 6,226,128 B1 | 5/2001 | Shiozawa | 359/642 |
| 6,298,080 B1 | 10/2001 | Heist et al. | 372/99 |
| 6,309,461 B1 | 10/2001 | Gianoulakis et al. | 117/200 |
| 6,342,312 B2 | 1/2002 | Oba et al. | 428/696 |
| 6,377,338 B1 | 4/2002 | Suenaga | 355/67 |
| 6,395,657 B2 | 5/2002 | Mayolet et al. | 501/3 |
| 6,451,111 B1 | 9/2002 | Beall et al. | 117/81 |
| 2002/0011202 A1 | 1/2002 | Gianoulakis et al. | 117/104 |
| 2002/1012497 | 8/2002 | Sparrow | 430/321 |

FOREIGN PATENT DOCUMENTS

| | | |
|---|---|---|
| EP | 0 875 778 A1 | 11/1998 |
| EP | 0 942 297 | 9/1999 |
| EP | 1 006 373 A2 | 6/2000 |
| EP | 0 869 203 B1 | 8/2001 |
| EP | 1 130 419 A2 | 9/2001 |
| EP | 1 139 138 B1 | 10/2001 |
| JP | 09-315894 | 12/1997 |
| JP | 10[1998]-1310 | 1/1998 |
| JP | 10[1998]-59799 | 3/1998 |
| WO | 91/11734 | 8/1991 |
| WO | 0 942 297 A2 | 9/1999 |
| WO | 99/46836 | 9/1999 |
| WO | 00/75697 A1 | 12/2000 |
| WO | 01/01182 | 1/2001 |
| WO | 01/37052 A1 | 5/2001 |
| WO | 02/31232 | 4/2002 |

OTHER PUBLICATIONS

U.S. Ser. No. 09/327,043, filed Jun. 7, 1999, Gianoulakis et al., Crystals Growth and Annealing Method and Apparatus, pp. 1–21.

OPTOVAC, Optical Crystal Handbook, Jan. 1993, pp. 1–41.

"Optical Characteristics of Large Single Crystals of Fluorides", Chernevskaya, E.G., et al., Opt. Technol. (USSR), Jun. 1973, vol. 40, No. 6 pp. 379–380.

Svetlto, O, Principles of Lasers:, $3^{rd}$ Ed., 1989, pp. 330–331.

Lambda Physik webpage: www.lambdaphysik.com/Microlithography/fullstory.asp?news_id=22, Lithography News, Lanbda Physik Ships Fifth 157nm Lithography Laser, p. 1.

Lambda Physik webpage: www.lambdaphysik.com/Microlithography/novaline.asp, Novaline ® Lithography Series, pp. 1–2.

Lambda Physik webpage: www.lambdaphysik.com/Microlithography/mooreslaw.asp, Lithography—History, Moore's Law, pp. 1–3.

"Lambda Physik Fourth Annual 157nm/EUV Symposium" website: http://www.lambdaphysik.com/microlithography/157. (printed out 11/01).

Lambda Physik webpage: www.lambdaphysik.com/Microlithography/fullstory.asp, Lithography News, Lambda Physik Announces Breakthrough in 157 nm F2 Lithography, pp. 1–2.

"Spatial Dispersion in the Dielectric Constant of GaAs," Yu et al., Solid State Comm, vol. 9, pp. 1421–1424, 1971.

"Technology at a Glance–Fall 2001," Website: http://www.nist.gov/public_affairs/taglance/tag01fall/fall2001.htm, pp. 1–11.

"Semicon West 2001," Website: http://www.nist.gov/public_affairs/factsheet/semiconwest01.htm.

"Metrology Supporting Deep Ultraviolet Lithography." Website:http://www.eeel.nist.gov/810.0/lithography_deep-.html, published Jun. 2001, Ofc of Microelectronic Programs.

"Minimizing Spatial–dispersion–induced birefringence in crystals used for precision optics by using mixed cystals of materials with the opposite sign of the birefringence." Website: http://physics.nist.gov/Divisions/Div842/Gp3/DUV-MatChar/birefring.html. updated Aug. 1, 2001.

"The Trouble with Calcium Fluoride." SPIEs oeMagazine, pp 23–25, Mar. 2002.

"$Ca_{1-x}Ba_xF_2$ and $Ca_{1-x}Sr_xF_2$ Mixed Crystals as potential solution to intrinsic birefringence problem for 157nm lithography," Burnett et al., SEMATECH 157nm Tech Data Rev, Dec. 11, 2001, NIST.

"Stress–Optical coefficients of 157nm Materials," Burnett et al., SEMATECH 157nm Tech Data Rev, Dec. 11, 2001, NIST.

"Intrinsic Birefringence in 157nm Materials," Burnett et al., $2^{nd}$ Int'l Symposium on 157nm Lithography, May 15, 2001, NIST.

NIST updates for Jul. 9, 2001, website: http://www.nist.gov/public_affairs/update/upd010709.htm, pp 1–8.

"Electron and Optical Physics Division" website: http://physics.nist.gov/TechAct/Div841/div841h.html, Tech Activities 2001, pp 1–9.

"Atomic Physics Division" website: http://physics.nist.gov/TechAct/Div842/div842h.html, Tech Activities 2001, pp 1–17.

"Plasma Radiation Group; DUV Sources and Materials Characterization" website: http://physics.nist.gov/Divisions/Div 842/Gp3/DIVMatChar/index.html., pp 1–2.

"Absolute refractive indices and thermal coefficients of fused silica and calcium fluoride near 193 nm," Appl Optics, vol. 37, No. 25, Sep. 1, 1998, pp 5964–5968.

"Intrinsic Birefringence in calcium fluoride and barium fluoride," Phys Review B, vol. 64, 241102(r), pp 1–4.

"Polarizability of Fluoride Ions in Fluorides with Fluorite–type structure" Sorokin, N.I., Crystallography Reports, vol. 45, No. 6, 2000, pp 976–978.

"Optical Anisotrophy of Silicon Single Crystals" Pastrnak et al., Phys Review B, vol. 3, No. 8, Apr. 15, 1971, pp 2567–2571.

Barium Fluoride and Magnesium Fluoride Product Information, ISP Corp, www.ispoptics.com.

Barium Fluoride Patinal product info, EM Industries, website: www.emicoe.com/barfluor.cfm.

"Materials Problem snags 157nm lithography" EETimes website: www.eetimes.com/story/OEG20010720S0106, Jul. 20, 2001, 4 pages.

"Industry Weighs shift to 157nm lithography" EETimes website: ww.eetimes.com/story/OEG20000518S0010, May 18, 2000, 4 pages.

PHOTOLITHOGRAPHIC METHOD AND UV TRANSMITTING FLUORIDE CRYSTALS WITH MINIMIZED SPATIAL DISPERSION

RELATED APPLICATIONS

This application claims the benefit of U.S. Provisional Application, Serial No. 60/322,408, filed Sep. 14, 2001 entitled PHOTOLITHOGRAPHIC METHOD AND UV TRANSMITTING FLUORIDE CRYSTALS WITH MINIMIZED SPATIAL DISPERSION, by D. C. Allan, N. F. Borrelli, C. M. Smith and R. W. Sparrow.

BACKGROUND OF THE INVENTION

1. Field of the Invention

The present invention relates generally to optical projection lithography methods and photolithography, and particularly to fluoride crystals with minimal spatial dispersion for use in optical photolithography systems utilizing ultraviolet light (UV) wavelengths below 200 nm, such as UV lithography systems utilizing wavelengths in the 193 nm region and the 157 nm region.

2. Technical Background

Projection optical photolithography methods/systems that utilize the ultraviolet wavelengths of light below 200 nm provide benefits in terms of achieving smaller feature dimensions. Such methods/systems that utilize ultraviolet wavelengths in the 157 nm and the 193 nm wavelength regions have the potential of improving the manufacturing of integrated circuits with smaller feature sizes. The commercial use and adoption of below 200 nm UV in high volume mass production of integrated circuits hinges on the availability of economically manufacturable optical fluoride crystals with high quality optical performance.

Fluoride crystals for use below 200-nm must have high internal transmission at the use wavelength (>98%/cm), high index of refraction homogeneity (<2 ppm) and low residual stress birefringence (<3 nm/cm). Stress birefringence is a consequence of the manufacturing process and can be minimized through careful annealing of the crystal. While the crystals typically used for these applications are cubic and so exhibit symmetric properties with respect to the crystal axes, they are not isotropic as for example, glass is. This distinction becomes clear when addressing a property called "spatial dispersion". Spatial dispersion is a property that is described as the presence of birefringence that is dependent on the direction of light propagation. Glass (an isotropic material) has no such dependence. In cubic crystals such as Ge, Si and GaP, however, there is such a dependence that is found to exhibit $1/\lambda^2$ variation with wavelength (Optical Anisotropy of Silicon Single Crystals, by J. Pastrnak and K. Vedam, PHYSICAL REVIEW B, VOLUME 3, NUMBER 8, APR. 15, 1971, p. 2567–2571; *COMPUTATIONAL SOLID STATE PHYSICS*, by Peter Y. Yu and Manuel Cardona, Plenum Press, N.Y., edited by F. Herman, 1972; Spatial Dispersion In The Dielectric Constant of GaAs, by Peter Y. Yu and Manuel Cardona, SOLID STATE COMMUNICATIONS, VOLUME 9, NUMBER 16, Aug. 15, 1971, pp.1421–1424). The effect we are describing, spatial dispersion, is absent from the dielectric response of a cubic crystal in the limit in which the wavelength of light, $\lambda$, is much larger than the spacing between atoms. As the wavelength becomes smaller, additional terms in the dielectric response are no longer negligible. In a cubic crystal, inversion symmetry of the crystal structure only allows the first nonzero contribution to occur at order $1/\lambda^2$ and not order $1/\lambda$. There is a mathematical description of dielectric response and crystal symmetry that uses tensors and their transformations to describe how dielectric response (including spatial dispersion) can depend on the direction of light propagation. Dielectric response is described using a rank 2 tensor, denoted $\epsilon_{ij}$. The lowest order effects of spatial dispersion can be described by a rank 4 tensor, here denoted $\alpha_{ijkl}$, from the relation $$\varepsilon_{ij}(\vec{q}) = \varepsilon_{ij}(\vec{q}=0) + \sum_{kl} \alpha_{ijkl} q_k q_l.$$

Here the symbol $\vec{q}$ represents the wavevector of light; it points in the direction of light propagation and its magnitude is $$\frac{2\pi}{\lambda}.$$

The equation shows that the long-wavelength or $\vec{q}=0$ part of the dielectric tensor gets corrected by the sum of elements of the $\alpha_{ijkl}$ tensor times the x-, y-, or z-components of the wavevector. (The sum on k and l is a sum over cartesian directions x, y, and z.) This correction term represents the source of spatial dispersion. In the absence of this term, a cubic crystal would have a completely isotropic dielectric tensor $\epsilon_{ij}$ and hence no spatial dispersion. Of the possible 3×3×3×3=81 terms in the $\alpha_{ijkl}$ tensor, only 3 are nonzero and distinct in a cubic crystal with m3m symmetry, such as zincblende or fluorite structure crystals. It is known that rank 4 tensors have 3 tensor invariants. In fully isotropic systems such as glass, the tensor $\alpha_{ijkl}$ can only have 2 independent nonzero elements, and obeys the relation $$(\alpha_{1111}-\alpha_{1122})/2-\alpha_{1212}=0.$$

The independent nonzero elements can be taken as $\alpha_{1111}$ and $\alpha_{1122}$. In a cubic system with m3m symmetry, the relation above need not be satisfied, and there are 3 independent nonzero elements of $\alpha_{ijkl}$. These may be taken as $\alpha_{1111}$, $\alpha_{1122}$, and $\alpha_{1212}$. Since the first two tensor invariants are present in isotropic glasses, they cannot impart any anisotropy. Thus all anisotropy from spatial dispersion in cubic crystals is associated with the relation $$(\alpha_{1111}-\alpha_{1122})/2-\alpha_{1212}\neq 0.$$

The value of this combination of tensor elements in a cubic system sets the scale for all anisotropic optical properties associated with spatial dispersion. These constants themselves depend on the wavelength of light with a variation that is typical of index dispersion, i.e. much less variation with wavelength than the explicit $1/\lambda^2$. This invention shows how to design a material in which $(\alpha_{1111}-\alpha_{1122})/2-\alpha_{1212}$ is minimized or preferably zero at a given wavelength of design.

Calcium fluoride, a potential material for use in UV lithography systems, also exhibits spatial dispersion. Spatial dispersion is an inherent property of the crystal and as such cannot be reduced by processing such as annealing. Stress-induced birefringence and spatial dispersion birefringence can be distinguished by their respective wavelength dependences. The variation of spatial dispersion with wavelength is very strong compared with the variation in index of refraction or stress-induced birefringence with wavelength, with stress birefringence exhibiting roughly the dependence expected for simply the index of refraction and spatial dispersion having $1/\lambda^2$ dependence.

Birefringence, whether it is derived from stress or the spatial properties of the crystal, can have a detrimental effect on high performance optical systems. The formation of multiple images is a major concern. Phase front distortion also presents problems both in terms of imaging and metrology. Given the wavelength dependence of spatial dispersion and the bandwidth of the lasers, dispersion becomes an important issue. It is thus of importance to minimize the amount of birefringence in a material for use in high performance optical imaging systems. As was mentioned previously, stress-related birefringence can be minimized by processing (annealing) while spatial dispersion is an inherent property that must be addressed in a different manner. One approach to the problem is to prepare mixed crystals that have minimized spatial dispersion; this is a single cubic fluoride crystal that contains 2 or 3 different alkaline earth metal cations that can deliver minimized spatial dispersion. This approach recognizes that the spatial birefringence of a given crystal is largely determined by the polarizability of the cation, by analogy with the Si and Ge crystals mentioned earlier. Specifically, we utilize a change in sign of the intrinsic birefringence for $SrF_2$, $CdF_2$, or $BaF_2$ relative to $CaF_2$ based on trends in polarizability.

SUMMARY OF THE INVENTION

The present invention includes an UV lithography method. The lithography method includes providing a radiation source with wavelength below 200-nm. The method includes providing cubic fluoride crystal optical elements having minimal spatial dispersion. The cubic fluoride crystals are comprised of a combination of alkaline earth cations having different optical polarizabilities such as to produce an overall isotropic polarizability that minimizes the fluoride crystal spatial dispersion below 200 nm. The rationale for producing the mixed crystal is based on the fact that the wavelength dependence of the dielectric tensor is expected to scale roughly with its wavelength-independent value, based on the quantum mechanical expressions for both cases. This means that more polarizable ions, with larger index of refraction, are also expected to contribute more to spatial dispersion. Some indication of this expected trend can be seen in the following table. For cubic crystal structures, the Clausius-Mossotti equation is valid, i.e., $$\frac{(n^2-1)}{(n^2+2)} = \frac{4\pi}{3}\sum N_j \alpha_j$$

where n is the refractive index, and $N_j$ is the concentration of ions of type j characterized by the electronic polarizability $\alpha_j$. A total molecular polarizability can be defined as $$\alpha \Sigma V_{mol} N_j \alpha_j$$

where $V_{mol}$ is the volume per molecule. In cubic fcc crystals such as fluorite, $V_{mol}=a^3/4$ where a is the cubic lattice constant. This allows us to solve for the molecular polarizability as $$\alpha = \frac{3a^3(n^2-1)}{16\pi(n^2+2)}.$$

Given lattice constants and indices of refraction for several cubic materials, the following table can be computed:

| crystal | a (Angstroms) | index n | α (Angstroms$^3$) | Δn × 10$^7$ |
|---|---|---|---|---|
| Si | 5.43 | 3.44 | 2.49 | +50 |
| GaAs | 5.653 | 3.4 | 8.40 | +70 |
| Ge | 5.66 | 4.00 | 9.02 | +135 |
| CaF2 | 5.463 | 1.434 | 2.534 | −11 |
| SrF2 | 5.800 | 1.438 | 3.057 | |
| BaF2 | 6.200 | 1.475 | 4.005 | |

In this table, the last column Δn×10$^7$ is the measured value of intrinsic birefringence for these materials. The clear trend among cubic semiconductors relates the magnitude of Δn and the molecular polarizability α. Similarly, the trend in molecular polarizability among the cubic fluorides is considered. $CaF_2$ has the lowest. The trend of Δn with polarizability suggests that any of the other cubic fluorides will have a Δn with a more positive value, enough to overcome the −11 value and ultimately drive to overall positive values of Δn.

Molecular polarizabilities are described in the above discussion however it is recognized that ionic polarizabilities of the cations can be used to formulate this discussion as well. All of the materials have the same ratio of cation to anion and have the same anion. A cubic crystal that incorporates an appropriate ratio of alkaline earth cations yields a material having minimized spatial dispersion.

The invention includes a fluoride crystal having a minimized amount of spatial dispersion. The fluoride combination crystal has a cubic fluoride crystal molecular structure and is comprised of a plurality of first alkaline earth metal cations and a plurality of second alkaline earth metal cations and a plurality of third alkaline earth metal cations. The first alkaline earth metal cations have a high polarizability and the second alkaline earth metal cations have a low polarizability. The appropriate combination of the first, second, and third alkaline earth metal cations in the fluoride crystal yields a crystal exhibiting minimized spatial dispersion.

DETAILED DESCRIPTION

Figure 1:
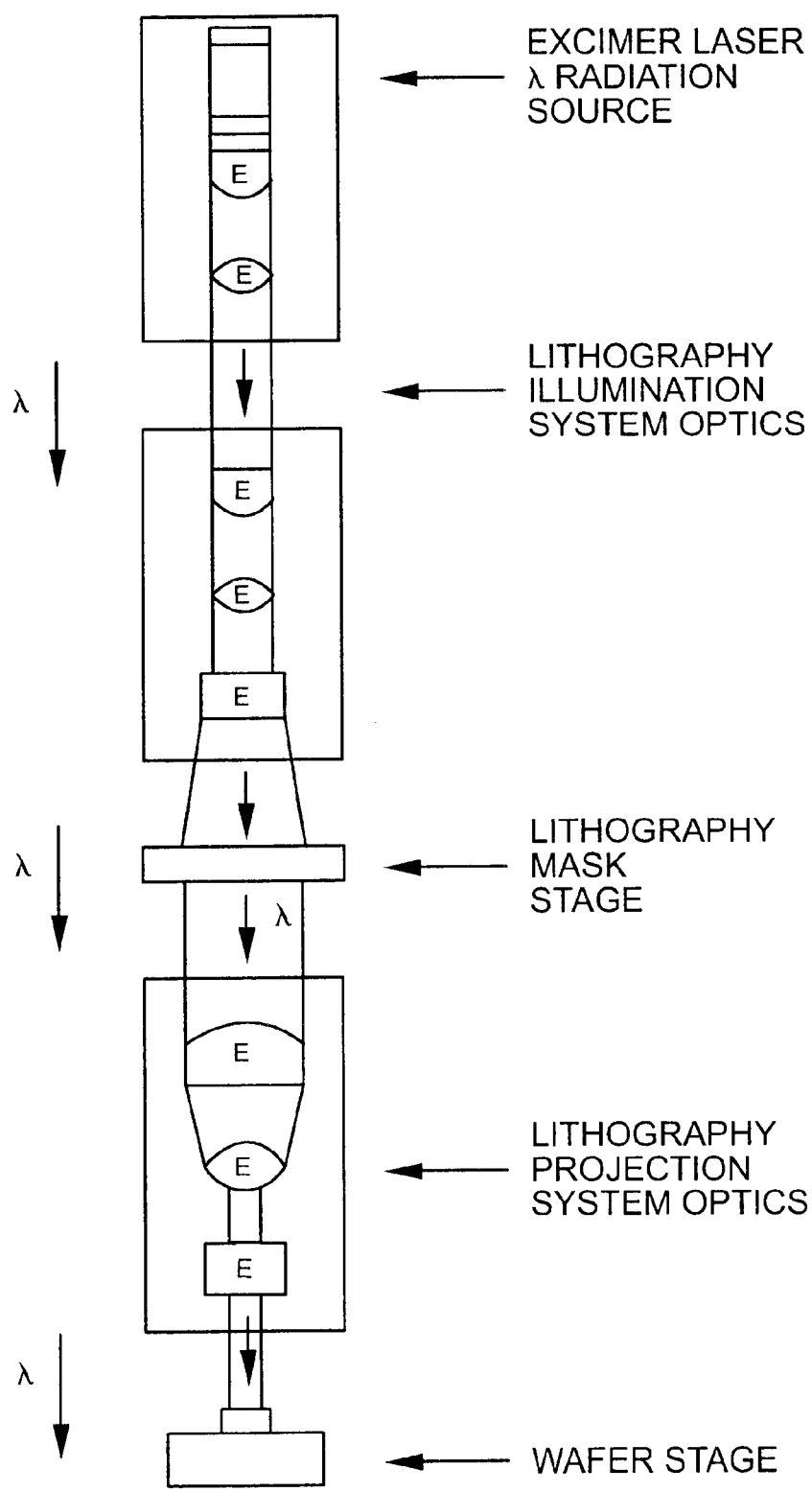
FIG. 1 shows a lithography method/system with cubic fluoride crystal optical elements E in accordance with the invention.

The invention includes a photolithographic method, such as shown in FIG. 1. The method includes providing a radiation source below 200-nm. Preferably the radiation source is an excimer laser which produces a laser emission wavelength λ of about 193 nm.

The invention includes photolithographic method, such as shown in FIG. 1. The method includes providing a radiation below 200 nm. Preferably the radiation source is an excimer laser which produces a laser emission wavelength λ of about 157 nm.

The method includes providing cubic fluoride crystal optical elements comprised of a combination of alkaline earth cations having different optical polarizabilities such as to produce an overall isotropic polarizability that minimizes the spatial dispersion below 200 nm.

Figure 2:
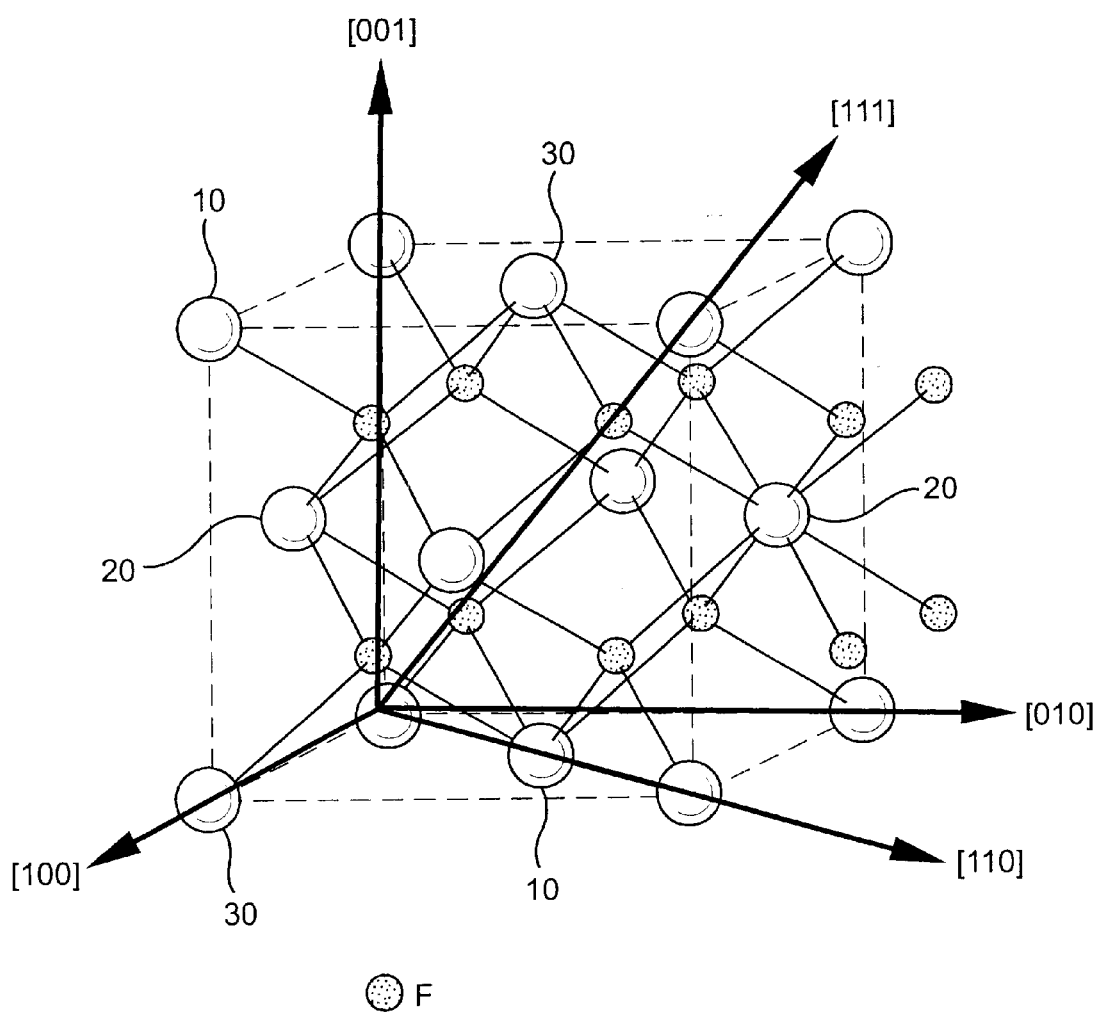
FIG. 2 shows a mixed cubic fluoride crystal in accordance with the invention.

FIG. 2 illustrates an embodiment of the cubic fluoride combination crystal of the invention with metal cations 10, 20, 30 having different optical polarizabilities. The combination of metal cations comprises a plurality of first metal cations 10 having a first optical polarizability combined with a plurality of second metal cations 20 having a second optical polarizability. Preferably, the combination of metal cations includes a plurality of third metal cations 30 having a third optical polarizability. The combination of different optical polarizabilities minimizes spatial dispersion in the vacuum UV wavelength range. The mixed cubic fluoride crystal preferably has an oxygen content less than 50 ppm by weight, more preferably less than 30 ppm by weight, and most preferably less than 10 ppm by weight. Preferably the low oxygen content mixed cubic fluoride crystal has a metallic contamination level less than 10 ppm by weight, more preferably less than 1 ppm by weight. Preferably the low oxygen content low metal contaminant cubic fluoride crystal has a 157 nm transmission level greater than 95%/cm, more preferably >97%/cm, and most preferred ≧99%/cm.

Figure 3:
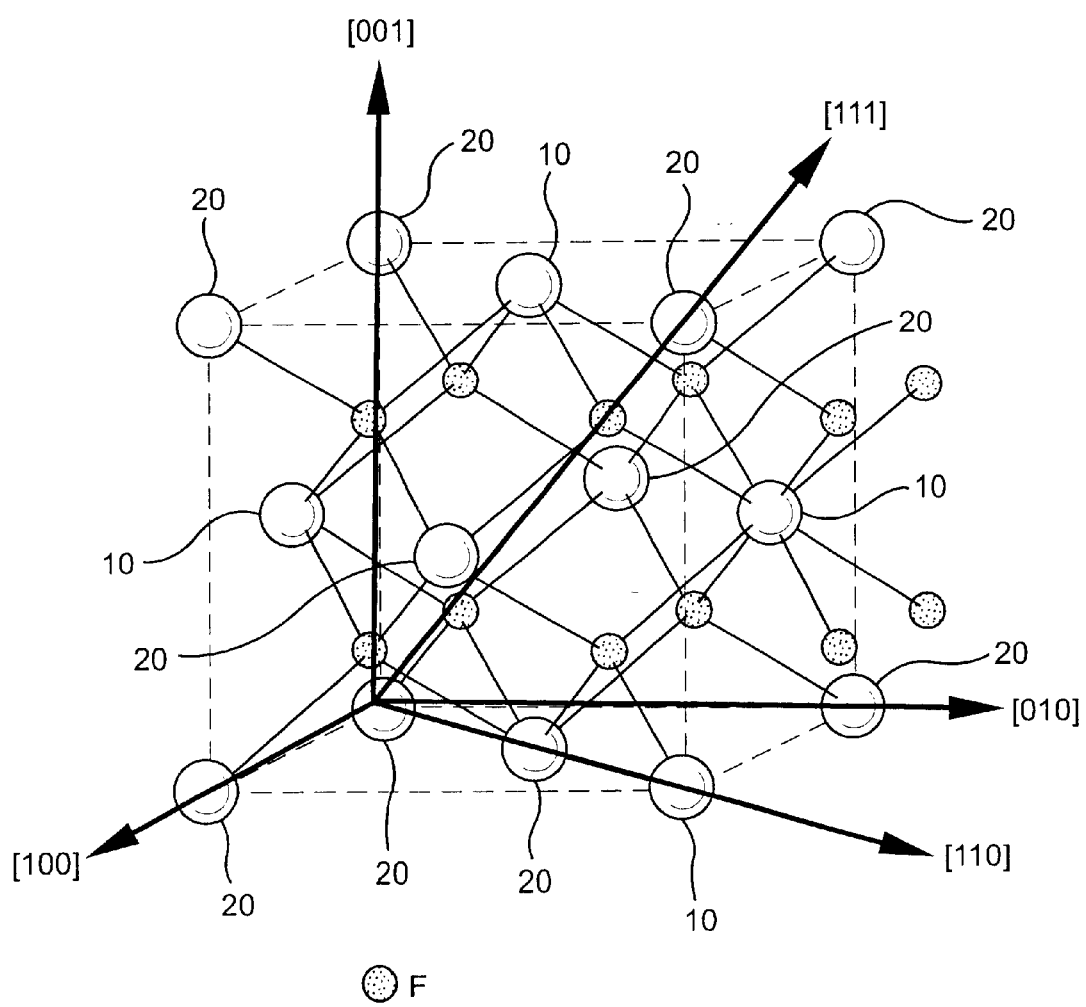
FIG. 3 shows a mixed cubic fluoride crystal in accordance with the invention.
Figure 4:
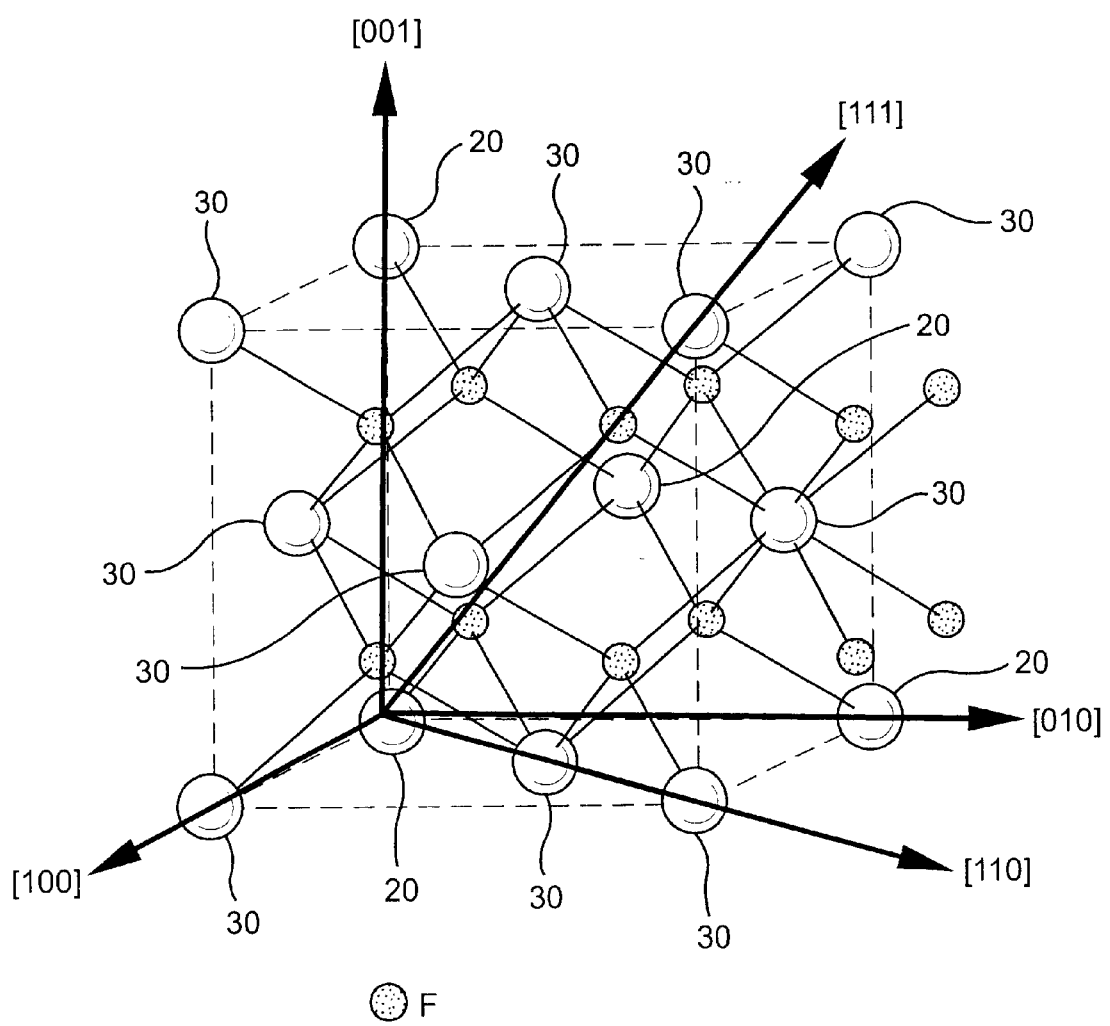
FIG. 4 shows a mixed cubic fluoride crystal in accordance with the invention.

The mixed fluoride crystal has a cubic structure such as illustrated in FIGS. 2–4. The fluoride combination crystal is comprised of a plurality of first alkaline earth metal cations and a plurality of second alkaline earth metal cations. The first alkaline earth metal cations have a high polarizability and the second alkaline earth metal cations have a low polarizability which is less than the first alkaline earth metal cation polarizability.

Preferably the second alkaline earth metal cations 20 are calcium. In a preferred embodiment the first alkaline earth metal cations are barium. In a preferred embodiment the first alkaline earth metal cations are strontium.

Preferably the mixed fluoride crystal has stress-birefringence at 633 nm less than 2 nm/cm, more preferably less than 1 nm/cm. Preferably the mixed fluoride crystal has an oxygen contamination level less than 50 ppm wt., most preferably <30 ppm wt., most preferably <10 ppm wt. Preferably the mixed fluoride crystal has a lead contamination level less than 1 ppm wt., more preferably <0.5 ppm wt. Preferably the optical fluoride crystal has a contaminating metal level less than 10 ppm wt., more preferably <5 ppm wt. Preferably the mixed fluoride crystal has an internal transmission at 157 nm of at least 95%/cm. Preferably the quantity of second alkaline earth metal cations is no less than the quantity of the first alkaline earth metal cations. Preferably the quantity of second alkaline earth metal cations is greater than the quantity of the first alkaline earth metal cations, more preferably the second metal cations quantity is no less than two times the first metal cations quantity, more preferably no less than three times, and more preferably no less than four times.

In an alternative preferred embodiment the quantity of the second alkaline earth metal cations is less than the quantity of the first alkaline earth metal cations, more preferably less than two times the quantity of the first alkaline earth metal cations, more preferably less than three times, more preferably less than four times, more preferably less than five times, more preferably less than six times, and more preferably less than seven times. Preferably the mixed fluoride crystal first metal cations high polarizability is greater than 0.5 Pauling polarizability cubic angstrom units and the second alkaline earth metal cations low polarizability is less than 0.5 Pauling polarizability cubic angstrom units. Preferably the second alkaline earth metal cations have a low polarizability less than 0.8 Pauling polarizability cubic angstrom units. Preferably the first alkaline earth metal cations have a high polarizability which is greater than 0.8 Pauling polarizability cubic angstrom units. Preferably the mixed fluoride crystal first alkaline earth metal cation has a crystal ionic radius in a greater than 1.05 and the second alkaline earth metal cation has a crystal ionic radius in a less than 1.05.

Preferably the mixed fluoride crystal first metal cations high polarizability is greater than 2.9 (Angstroms$^3$) $\alpha$ molecular polarizability and the second alkaline earth metal cations low polarizability is less than 2.9 (Angstroms$^3$) $\alpha$ molecular polarizability. Preferably the second alkaline earth metal cations have a low polarizability less than about 2.6 (Angstroms$^3$) $\alpha$ molecular polarizability. Preferably the first alkaline earth metal cations have a high polarizability which is greater than about 3 (Angstroms$^3$) $\alpha$ molecular polarizability. Preferably the mixed fluoride crystal first alkaline earth metal cation has a cubic lattice constant $\alpha$>5.6 (Angstroms) and the second alkaline earth metal cation has a cubic lattice constant $\alpha$<5.6 (Angstroms).

As shown in FIG. 2, in an embodiment the mixed fluoride crystal is a combination of three metal cations including third metal cations having a third polarizability. Preferably the first metal cations high polarizability is greater than 1 Pauling polarizability cubic angstrom units and the second alkaline earth metal cations low polarizability is less than 0.5 Pauling polarizability cubic angstrom units and the third alkaline earth metal cations polarizability is between 0.5 and 1 Pauling polarizability cubic angstrom units. Preferably the mixed fluoride crystal first metal cations high polarizability is greater than 3.9 (Angstroms$^3$) $\alpha$ molecular polarizability and the second alkaline earth metal cations low polarizability is less than 2.6 (Angstroms$^3$) $\alpha$ molecular polarizability, and the third alkaline earth metal cation polarizability is between 2.6 and 3.9(Angstroms$^3$) a molecular polarizability. Preferably the mixed fluoride crystal first alkaline earth metal cation has a cubic lattice constant $\alpha$>6 (Angstroms) and the second alkaline earth metal cation has a cubic lattice constant $\alpha$<5.5 (Angstroms) and the third alkaline earth metal cation has a cubic lattice constant $\alpha$ between 5.5 and 6(Angstroms).

The invention includes a mixed fluoride crystal that exhibits minimal spatial dispersion. The mixed crystal has a cubic structure with a plurality of first alkaline earth metal cations, a plurality of second alkaline earth metal cations and a plurality of third alkaline earth metal cations. The first alkaline earth metal cations have a high polarizability and the second alkaline earth metal cations have a low polarizability and the third alkaline earth metal cations having an intermediate polarizability. The first and third alkaline earth metal cations provide the ability to impart positive spatial dispersion at short wavelengths while the second alkaline earth metal cations provides negative spatial dispersion. Preferably the first alkaline earth metal cations high polarizability is greater than 1 Pauling polarizability cubic angstrom units, the second alkaline earth metal cations low polarizability is less than 0.5 Pauling polarizability cubic angstrom units and the third alkaline earth metal cations intermediate polarizability is between 0.5 and 1 Pauling polarizability cubic angstrom units. Preferably the crystal has a stress-birefringence at 633 nm less than 5 nm/cm, an oxygen contamination level <50 ppm. wt. and an internal transmission at 157 nm of at least 95%/cm. Preferably the crystal first alkaline earth metal cation has a crystal ionic radius in Å greater than 1.25 and the second alkaline earth metal cation has a crystal ionic radius in Å less than 1.05 and the third alkaline earth metal cation has a crystal ionic radius in Å between 1.05 and 1.25

Figure 5:
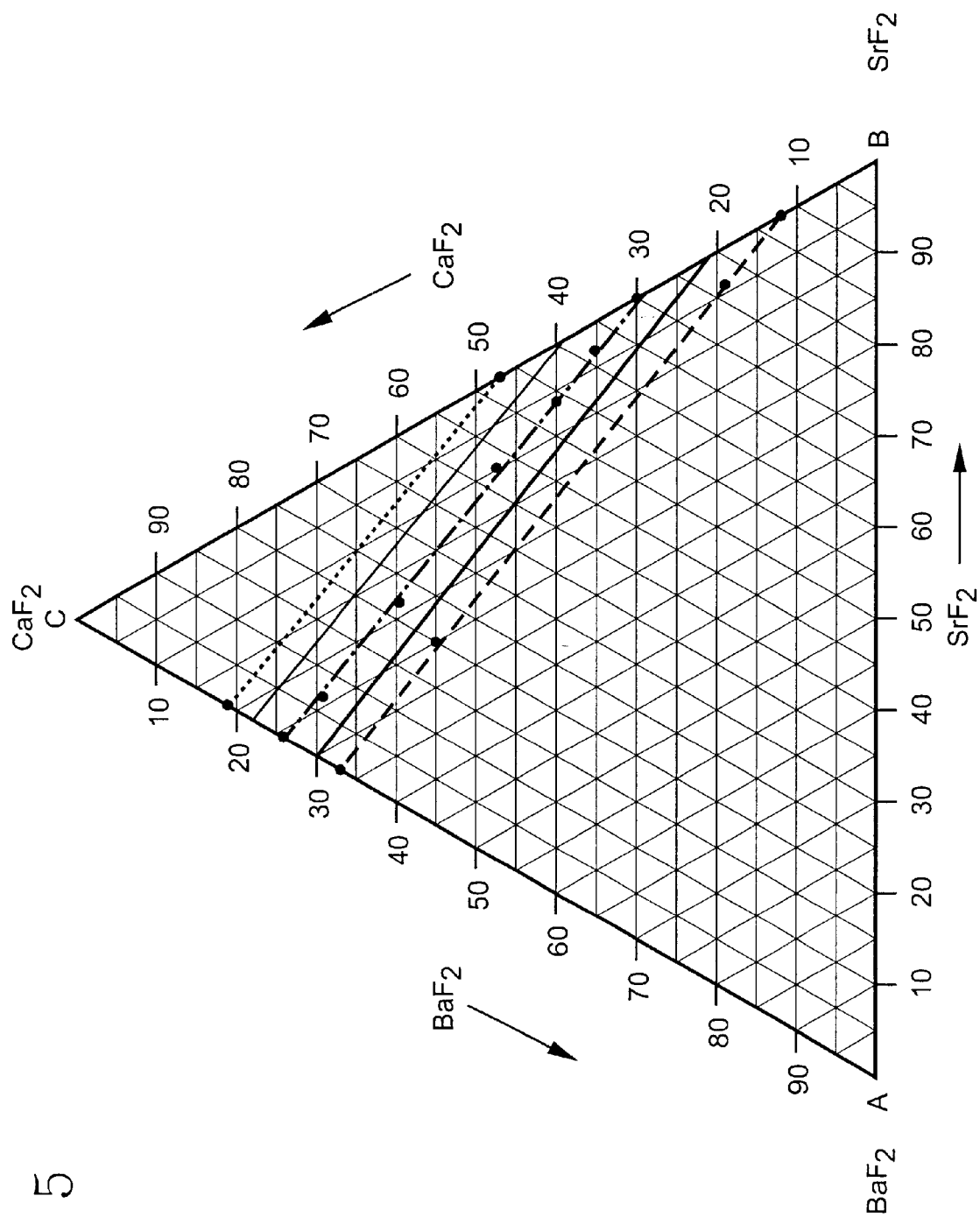
FIG. 5 shows a molar ratio chart of mixed cubic fluoride crystals in accordance with the invention.

FIG. 2 illustrates embodiments of the invention where the mixed crystal is a combination of three different alkaline earth metal cations 10, 20, and 30. The molar ratio chart of FIG. 5 shows the preferred compositions of the three different alkaline earth metal cations with the low polarizability cation being Ca, the high polarizability cation being Ba, and the intermediate polarizability cation being Sr. Table 1 discloses $CaF_2+BaF_2+SrF_2$ mixed crystal weight percent examples A1–A5 in accordance with the invention. The alkaline earth combination crystal weight percent ranges of $CaF_2$ (low polarizability)+$BaF_2$ (high polarizability)+$SrF_2$ (intermediate polarizability) are 6 to 35 wt. % $CaF_2$, 29 to 45 wt. % $BaF_2$, and 37 to 49 wt. % $SrF_2$; particularly preferred 6.8–32.6 wt. % $CaF_2$, 29.6–44.7 wt. % $BaF_2$, and 37.9–48.5 wt. % $SrF_2$. More preferred ranges are 12 to 26 wt. % $CaF_2$, 32 to 41 wt. % $BaF_2$, and 41 to 48 wt. % $SrF_2$; particularly, more preferred 12.6–25.8 wt. % $CaF_2$, 32.7–40.3 wt. % $BaF_2$, and 41.5–47.2 wt. % $SrF_2$. Most preferred ranges are 17 to 21 wt. % $CaF_2$, 33 to 38 wt. % $BaF_2$, and 43 to 47 wt. % $SrF_2$; particularly most preferred 18.9±2 wt. % $CaF_2$, 35.4±2 wt. % $BaF_2$, and 45.67±2 wt. % $SrF_2$. Particularly most preferred the three cation combination crystal is 18.9±wt. % $CaF_2$, 35.4±wt. % $BaF_2$, and 45.67±1 wt. % $SrF_2$.

TABLE 1

$CaF_2 + BaF_2 + SrF_2$ Mixed Crystal Wt. %

|  | A1 | A2 | A3 | A4 | A5 |
|---|---|---|---|---|---|
| $CaF_2$ | 32.56 | 18.92 | 6.82 | 12.56 | 25.80 |
| $BaF_2$ | 29.55 | 35.41 | 44.69 | 40.29 | 32.69 |
| $SrF_2$ | 37.89 | 45.67 | 48.49 | 47.15 | 41.51 |

Alkaline Earth Combination Crystal Wt. % Ranges of $CaF_2 + BaF_2 + SrF_2$

|  | Preferred | More Preferred | Most Preferred |
|---|---|---|---|
| $CaF_2$ | 6 to 35 wt. % (6.8 to 32.6) | 12 to 26 wt. % (12.6 to 25.8) | 17 to 21 wt. % (18.9 ± 2; ±1) |
| $BaF_2$ | 29 to 45 wt. % (29.6 to 44.7) | 32 to 41 wt. % (32.7 to 40.3) | 33 to 38 wt. % (35.4 ± 2; ±1) |
| $SrF_2$ | 37 to 49 wt. % (37.9 to 48.5) | 41 to 48 wt. % (41.5 to 47.2) | 43 to 47 wt. % (45.67 ± 2; ±1) |

FIG. 3 illustrates embodiments of the invention where the mixed crystal is a combination of two different alkaline earth metal cations 10 and 20. The high polarizability cation is Ba and the low polarizability cation is Ca. Table 2 discloses $CaF_2$±$BaF_2$ mixed crystal weight percent examples B1–B5 in accordance with the invention. The alkaline earth combination crystal weight percent ranges of $CaF_2$ (low polarizability)+$BaF_2$ (high polarizability) are 47 to 66 wt. % $CaF_2$ and 34 to 53 wt. % $BaF_2$; particularly preferred 47.5–65.5 wt. % $CaF_2$ and 34.5–52.5 wt. % $BaF_2$. More preferred ranges are 51 to 63 wt. % $CaF_2$ and 38 to 49 wt. % $BaF_2$; particularly more preferred 51–61.2 wt. % $CaF_2$ and 38.8–49 wt. % $BaF_2$. Most preferred ranges are 55 to 59 wt. % $CaF_2$ and 40 to 45 wt. % $BaF_2$; particularly 57.2±2 wt. % $CaF_2$ and 42.8±2 wt. % $BaF_2$. Particularly most preferred is 57.2±1 wt. % $CaF_2$ and 42.8±1 wt. % $BaF_2$.

TABLE 2

$CaF_2 + BaF_2$ Mixed Crystal Wt. %

|  |  | Mole % | Weight % |
|---|---|---|---|
| B1 | $CaF_2$ | 81 | 65.5 |
|  | $BaF_2$ | 19 | 34.5 |
| B2 | $CaF_2$ | 67 | 47.5 |
|  | $BaF_2$ | 33 | 52.5 |
| B3 | $CaF_2$ | 75 | 57.2 |
|  | $BaF_2$ | 25 | 42.8 |
| B4 | $CaF_2$ | 78 | 61.2 |
|  | $BaF_2$ | 22 | 38.8 |
| B5 | $CaF_2$ | 70 | 51 |
|  | $BaF_2$ | 30 | 49 |

Alkaline Earth Combination Crystal Wt. % Ranges of $CaF_2 + BaF_2$

|  | Preferred | More Preferred | Most Preferred |
|---|---|---|---|
| $CaF_2$ | 47 to 66 wt. % (47.5 to 65.5) | 51 to 63 wt. % (51 to 61.2) | 55 to 59% (57.2) |
| $BaF_2$ | 34 to 53 wt. % (34.5 to 52.5) | 38 to 49 wt. % (38.8 to 49) | 40 to 45% (42.8) |

FIG. 4 illustrates embodiments of the invention where the mixed crystal is a combination of two different alkaline earth metal cations 20 and 30. The high polarizability cation is Sr and the low polarizability cation is Ca. Table 3 discloses $CaF_2+SrF_2$ mixed crystal weight percent examples C1–C5 in accordance with the invention. The alkaline earth combination crystal weight percent ranges of $CaF_2$ (low polarizability)+$SrF_2$ (high polarizability) are 7 to 36 wt. % $CaF_2$ and 64 to 93 wt. % $SrF_2$; particularly preferred 7.8–35.5 wt. % $CaF_2$ and 64.5–92.2 wt. % $SrF_2$. More preferred ranges are 14 to 29 wt. % $CaF_2$ and 71 to 86 wt. % $SrF_2$; particularly preferred 14.2–28.4 wt. % $CaF_2$ and 71.6–85.8 wt. % $SrF_2$. Most preferred ranges are 18 to 24 wt. % $CaF_2$ and 76 to 82 wt. % $SrF_2$; particularly 21±2 wt. % $CaF_2$ and 79±2 wt. % $SrF_2$.

TABLE 3

$CaF_2 + SrF_2$ Mixed Crystal Wt. %

|  |  | Mole % | Weight % |
|---|---|---|---|
| C1 | $CaF_2$ | 12 | 7.8 |
|  | $SrF_2$ | 88 | 92.2 |
| C2 | $CaF_2$ | 47 | 35.5 |
|  | $SrF_2$ | 53 | 64.5 |
| C3 | $CaF_2$ | 30 | 21 |
|  | $SrF_2$ | 70 | 79 |
| C4 | $CaF_2$ | 21 | 14.2 |
|  | $SrF_2$ | 79 | 85.8 |
| C5 | $CaF_2$ | 39 | 28.4 |
|  | $SrF_2$ | 61 | 71.6 |

Alkaline Earth Combination Crystal Wt. % Ranges of $CaF_2 + SrF_2$

|  | Preferred | More Preferred | Most Preferred |
|---|---|---|---|
| $CaF_2$ | 7 to 36 wt. % (7.8 to 35.5) | 14 to 29 wt. % (14.2 to 28.4) | 18 to 24%; 20 to 22% (21) |
| $SrF_2$ | 64 to 93 wt. % (64.5 to 92.2) | 71 to 86 wt. % (71.6 to 85.8) | 76 to 82%; 78 to 80% (79) |

The present invention overcomes problems in the prior art and provides a means for economically manufacturing high quality crystals that can be used to improve the manufacturing of integrated circuits with ultraviolet wavelengths below 200-nm. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A UV lithography method, said method comprising:
   providing a below 200 nm radiation source for producing <200-nm light,
   providing a plurality of mixed cubic fluoride crystal optical elements, said cubic fluoride crystal comprised of a combination of alkaline earth cations having different optical polarizabilities such as to produce an overall isotropic polarizability which minimizes the fluoride crystal spatial dispersion below 200 nm,
   transmitting said <200-nm light through said cubic fluoride crystal optical elements,
   forming a lithography pattern with said light,
   reducing said lithography pattern and projecting said lithography pattern with said cubic fluoride crystal optical elements onto a UV radiation sensitive lithography printing medium to form a printed lithographic pattern.

2. A method as claimed in claim 1 wherein providing said below 200 nm radiation source includes providing an excimer laser which produces a laser emission wavelength of 193 nm.

3. A method as claimed in claim 1 wherein providing said below 200 nm radiation source includes providing an excimer laser which produces a laser emission wavelength of 157 nm.

4. A method as claimed in claim 1 wherein said combination of metal cations comprises a plurality of first metal cations having a first optical polarizability combined with a plurality of second metal cations having a second optical polarizability.

5. A method as claimed in claim 4 wherein said combination of metal cations comprises a plurality of third metal cations having a third optical polarizability.

6. A method as claimed in claim 1 wherein said crystal has an oxygen content less than 50 ppm by weight.

7. A method as claimed in claim 1 wherein said crystal has a metallic contamination level less than 10 ppm by weight.

8. A method as claimed in claim 1 wherein said crystal has a 157 nm transmission level greater than 95%/cm.

9. A mixed fluoride crystal for transmitting <200-nm light with a minimized amount of spatial dispersion, said mixed crystal having a cubic structure and comprised of a plurality of first metal cations and a plurality of second metal cations, said first metal cations having a high polarizability and said second metal cations having a low polarizability, said first metal cations providing an ability to impart positive spatial dispersion and said second metal cations providing an ability to impart negative spatial dispersion.

10. A mixed fluoride crystal as claimed in claim 9 wherein said crystal has a stress-birefringence at 633 nm less than 2 nm/cm.

11. A mixed fluoride crystal as claimed in claim 9 wherein said crystal has an oxygen contamination level less than 50 ppm by weight.

12. A mixed fluoride crystal as claimed in claim 9 wherein said crystal has an lead contamination less than 1 ppm by weight.

13. A mixed fluoride crystal as claimed in claim 9 wherein said crystal has a contaminating metal level less than 10 ppm by weight.

14. A mixed fluoride crystal as claimed in claim 9 wherein said crystal has an internal transmission at 157 nm of at least 95%/cm.

15. A mixed fluoride crystal as claimed in claim 9 wherein the quantity of said second metal cations is no less than the quantity of said first metal cations.

16. A mixed fluoride crystal as claimed in claim 15 wherein the quantity of said second metal cations is greater than the quantity of said first metal cations.

17. A mixed fluoride crystal as claimed in claim 16 wherein the quantity of said second metal cations is no less than two times the quantity of said first metal cations.

18. A mixed fluoride crystal as claimed in claim 17 wherein the quantity of said second metal cations is no less than three times the quantity of said first metal cations.

19. A mixed fluoride crystal as claimed in claim 18 wherein the quantity of said second metal cations is no less than four times the quantity of said first metal cations.

20. A mixed fluoride crystal as claimed in claim 9 wherein the quantity of said second metal cations is less than the quantity of said first metal cations.

21. A mixed fluoride crystal as claimed in claim 20 wherein the quantity of said second metal cations is less than two times the quantity of said first metal cations.

22. A mixed fluoride crystal as claimed in claim 21 wherein the quantity of said second metal cations is less than three times the quantity of said first metal cations.

23. A mixed fluoride crystal as claimed in claim 22 wherein the quantity of said second metal cations is less than four times the quantity of said first metal cations.

24. A mixed fluoride mixed crystal as claimed in claim 9 wherein said crystal is 111 oriented.

25. A mixed fluoride mixed crystal as claimed in claim 9 wherein said crystal is 001 oriented.

26. A mixed fluoride crystal as claimed in claim 9 wherein said cubic structure of metal cations comprises a plurality of third metal cations having a third polarizability.

27. A mixed fluoride crystal as claimed in claim 26 wherein said first metal cations' high polarizability is greater than 1 Pauling polarizability cubic angstrom units and said second alkaline earth metal cations' low polarizability is less than 0.5 Pauling polarizability cubic angstrom units and said third alkaline earth metal cations' polarizability is between 0.5 and 1 Pauling polarizability cubic angstrom units.

28. A mixed fluoride crystal as claimed in claim 9 wherein said first metal cations' high polarizability is greater than 0.5 Pauling polarizability cubic angstrom units and said second alkaline earth metal cations' low polarizability is less than 0.5 Pauling polarizability cubic angstrom units.

29. A mixed fluoride crystal as claimed in claim 9 wherein said first alkaline earth metal cation has a crystal ionic radius greater than 1.05 Angstroms and said second alkaline earth metal cation has a crystal ionic radius less than 1.05 Angstroms.

30. A mixed fluoride crystal for transmitting light below 200 nm light with a minimized amount of spatial dispersion, said crystal having a cubic structure and comprised of a plurality of first alkaline earth metal cations and a plurality of second alkaline earth metal cations and a plurality of third alkaline earth metal cations, said first alkaline earth metal cations having a high polarizability and said second alkaline earth metal cations having a low polarizability and said third alkaline earth metal cations having an intermediate polarizability, said first alkaline earth metal cations providing an ability to provide positive spatial dispersion to <200 nm light and said third alkaline earth metal cations providing a capacity to impart positive spatial dispersion to <200 nm light and said second alkaline earth metal cations providing an ability to impart negative intrinsic-birefringence to <200 nm light.

31. A mixed fluoride crystal as claimed in claim 30 wherein said first alkaline earthmetal cations' high polarizability is greater than 1 Pauling polarizability cubic angstrom units and said second alkaline earth metal cations' low polarizability is less than 0.5 Pauling polarizability cubic angstrom units and said third alkaline earth metal cations' intermediate polarizability is between 0.5 and 1 Pauling polarizability cubic angstrom units.

32. A mixed fluoride crystal as claimed in claim 30 wherein said crystal has a stress-birefringence at 633 nm less than 5 nm/cm, an oxygen contamination level <50 ppm by weight, and an internal transmission at 157 nm of at least 95%/cm.

33. A mixed fluoride crystal as claimed in claim 30 wherein said first alkaline earth metal cation has a crystal ionic radius greater than 1.25 Angstroms and said second alkaline earth metal cation has a crystal ionic radius less than 1.05 Angstroms and said third alkaline earth metal cation has a crystal ionic radius between 1.05 and 1.250 Angstroms.

* * * * *

Adverse Decision in Interference

Patent No. 6,649,326, Douglas C. Allan, Nicholas F. Borrelli, Charlene M. Smith, Robert W. Sparrow, PHOTOLITHOGRAPHIC METHOD AND UV TRANSMITTING FLUORIDE CRYSTALS WITH MINIMIZED SPATIAL DISPERSION, Interference No. 105,316, final judgment adverse to the patentees rendered, January 12, 2006, as to claims Counts 1, 2 and 3.

*(Official Gazette April 18, 2006)*